United States Patent
Motoki et al.

(10) Patent No.: US 8,240,016 B2
(45) Date of Patent: Aug. 14, 2012

(54) METHOD FOR MANUFACTURING MULTILAYER ELECTRONIC COMPONENT

(75) Inventors: Akihiro Motoki, Fukui (JP); Makoto Ogawa, Fukui (JP); Kenichi Kawasaki, Echizen (JP); Shunsuke Takeuchi, Echizen (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 121 days.

(21) Appl. No.: 12/770,914

(22) Filed: Apr. 30, 2010

(65) Prior Publication Data

US 2010/0206476 A1    Aug. 19, 2010

Related U.S. Application Data

(62) Division of application No. 12/142,924, filed on Jun. 20, 2008, now Pat. No. 7,764,484.

(30) Foreign Application Priority Data

Mar. 4, 2008    (JP) ................................. 2008-053654

(51) Int. Cl.
*H01G 7/00*    (2006.01)
(52) U.S. Cl. ..................... 29/25.42; 29/25.41; 29/25.03; 361/306.1
(58) Field of Classification Search ...... 29/25.41–25.42, 29/830–831, 846–847; 361/306.1, 306.3, 361/309–310, 321.1–361.4, 321.1–321.1
See application file for complete search history.

(56) References Cited

U.S. PATENT DOCUMENTS

| | | | | |
|---|---|---|---|---|
| 4,652,967 A * | 3/1987 | Sakabe et al. | ................. | 361/309 |
| 5,805,409 A * | 9/1998 | Takahara et al. | ............. | 361/303 |
| 6,344,963 B1 * | 2/2002 | Mori | ........................... | 361/306.3 |
| 6,400,553 B2 * | 6/2002 | Yoshii et al. | ............... | 361/321.2 |
| 6,663,798 B2 * | 12/2003 | Sato et al. | ..................... | 252/512 |
| 6,785,941 B2 * | 9/2004 | Nakamura | ................... | 29/25.42 |
| 7,285,232 B2 * | 10/2007 | Miki | ............................. | 252/514 |
| 7,295,421 B2 * | 11/2007 | Mihara et al. | .............. | 361/308.1 |
| 7,764,484 B2 * | 7/2010 | Motoki et al. | ............. | 361/306.1 |

(Continued)

FOREIGN PATENT DOCUMENTS

CN    1658332 A    8/2005

(Continued)

OTHER PUBLICATIONS

Official Communication issued in corresponding Chinese Patent Application No. 200810127429.1, mailed on May 12, 2011.

(Continued)

*Primary Examiner* — Minh Trinh
(74) *Attorney, Agent, or Firm* — Keating & Bennett, LLP (57) ABSTRACT

A method for manufacturing a multilayer electronic component includes a step of preparing a laminate which includes a plurality of stacked insulator layers and a plurality of internal electrodes extending along the interfaces between the insulator layers, and in which an end of each of the plurality of internal electrodes is exposed at a predetermined surface corresponding to one of the first and second end surfaces; a step of forming external electrodes on the predetermined surfaces; and a step of forming thick-film edge electrodes at edge portions. The step of forming external electrodes includes a step of attaching a plurality of conductive particles having a particle size of about 1 μm or more to the predetermined surfaces of the laminate, and a step of performing plating directly on the predetermined surfaces to which the conductive particles are attached.

6 Claims, 4 Drawing Sheets

U.S. PATENT DOCUMENTS

| | | |
|---|---|---|
| 2005/0184278 A1 | 8/2005 | Miki |
| 2006/0039097 A1 | 2/2006 | Satou |

FOREIGN PATENT DOCUMENTS

| | | |
|---|---|---|
| CN | 1755849 A | 4/2006 |
| JP | 05-343259 A | 12/1993 |
| JP | 2003-73890 A1 | 3/2003 |
| JP | 2005-236161 A | 9/2005 |

OTHER PUBLICATIONS

Official Communication issued in corresponding Chinese Patent Application No. 200810127429.1, mailed on Sep. 30, 2010.

Motoki et al.; "Multilayer Electronic Component and Method for Manufacturing the Same"; U.S. Appl. No. 12/142,924, filed Jun. 20, 2008.

Official Communication issued in corresponding Japanese Patent Application No. 2008-053654, mailed on Feb. 14, 2012.

* cited by examiner

METHOD FOR MANUFACTURING MULTILAYER ELECTRONIC COMPONENT

BACKGROUND OF THE INVENTION

1. Field of the Invention

The present invention relates to multilayer electronic components and methods for manufacturing the same. More particularly, the present invention relates to a multilayer electronic component in which external electrodes are formed by plating directly on the outer surface of a laminate and a method for manufacturing the same.

2. Description of the Related Art

Figure 4:
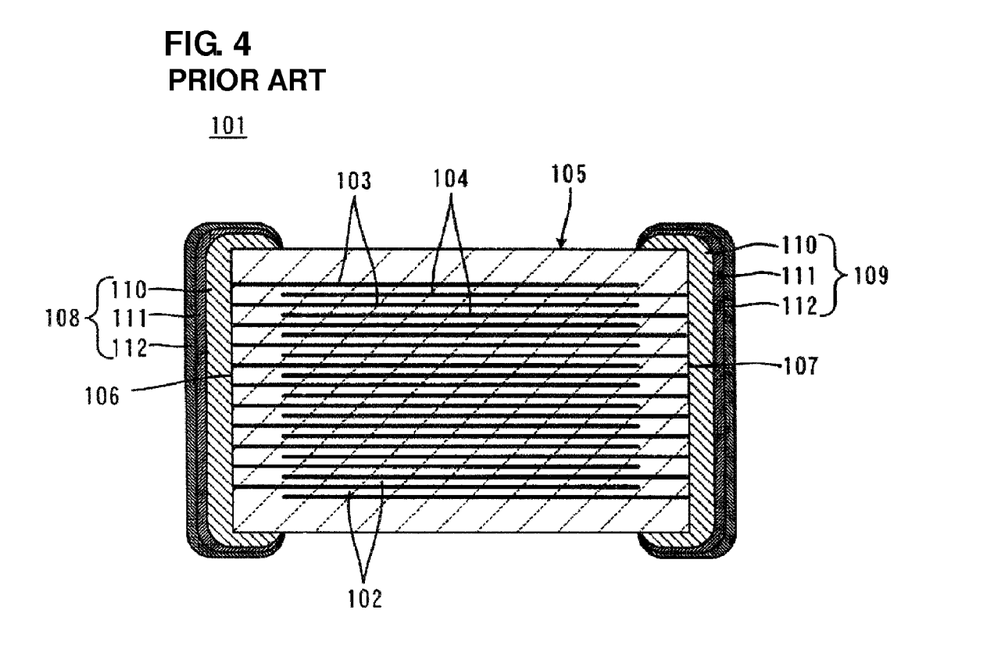
FIG. 4 is a cross-sectional view showing a known multilayer electronic component.

Referring to FIG. 4, a multilayer electronic component 101, exemplified by a monolithic ceramic capacitor, typically includes a laminate 105 which includes a plurality of stacked insulator layers 102 and a plurality of internal electrodes 103 and 104, extending along the interfaces between the insulator layers 102. An end of each of the plurality of internal electrodes 103 and an end of each of the plurality of internal electrodes 104 are respectively exposed at an end surface 106 and an end surface 107 of the laminate 105. An external electrode 108 is disposed so as to electrically connect the ends of the internal electrodes 103, and an external electrode 109 is disposed so as to electrically connect the ends of the internal electrodes 104.

In order to form the external electrodes 108 and 109, first, a metal paste including a metal component and a glass component is applied on the end surfaces 106 and 107 of the laminate 105, followed by baking to form an electrode paste film 110 on each of the end surfaces 106 and 107. Next, a first plating film 111 including Ni as a major component, for example, is formed on the electrode paste film 110, and a second plating film 112 including Sn as a major component, for example, is further formed thereon. That is, each of the external electrodes 108 and 109 has a three-layered structure including the electrode paste film 110, the first plating film 111, and the second plating film 112.

The external electrodes 108 and 109 are required to have good wettability with respect to solder when the multilayer electronic component 101 is mounted on a substrate by soldering. Furthermore, the external electrode 108 is required to have a function of electrically connecting the plurality of internal electrodes 103 which are electrically isolated from each other, and the external electrode 109 is required to have a function of electrically connecting the plurality of internal electrodes 104 which are electrically isolated from each other. The function of ensuring wettability is provided by the second plating film 112, and the function of electrically connecting the internal electrodes 103 or 104 is provided by the electrode paste film 110. The first plating film 111 has a function of preventing solder leaching during the soldering operation.

However, the thickness of the electrode paste film 110 is relatively large ranging from about several tens of micrometers to several hundred micrometers. Consequently, in order to set the size of the multilayer electronic component 101 within the predetermined size range, since the volume of the electrode paste film 110 must be secured, undesirably, it is necessary to decrease the effective volume required to provide capacitance. Meanwhile, the thickness of each of the plating films 111 and 112 is about several micrometers, and therefore, if the first plating film 111 and the second plating film 112 alone can define each of the external electrodes 108 and 109, it is possible to have a larger effective volume required to ensure capacitance.

In order to form external electrodes by plating directly on the end surfaces of the laminate, it is necessary not only to precipitate plating deposits on the ends of the plurality of internal electrodes exposed at the end surfaces of the laminate but also to grow the plating deposits so as to be linked to each other. However, as the distance between the ends of the adjacent internal electrodes increases, the linking is less easily achieved even if plating growth occurs. In such a case, joining defects may occur between the internal electrodes and the plating films, or the insulation resistance may be degraded due to penetration of moisture or other contaminants.

For example, Japanese Unexamined Patent Application Publication No. 2004-40084 describes a technique that can overcome the problem described above. Japanese Unexamined Patent Application Publication No. 2004-40084 describes that the ends of dummy electrodes are exposed at locations at which the ends of internal electrodes are not exposed in regions where external electrodes are intended to be formed. Thereby, even in a region where the exposed ends of the internal electrodes are not distributed or the distribution density is low, linking of the plating deposits is facilitated. Consequently, it is possible to form external electrodes in a satisfactory state by plating. Furthermore, by using the technique described in Japanese Unexamined Patent Application Publication No. 2004-40084, it is possible to form external electrodes on side surfaces of the laminate at which the ends of internal electrodes are not exposed.

However, when the technique described in Japanese Unexamined Patent Application Publication No. 2004-40084 is used, it is necessary to form internal electrodes as dummy electrodes in addition to the original internal electrodes. Consequently, the total number of internal electrodes to be formed increases, and the internal electrode formation step becomes complicated, resulting in an increase in manufacturing cost. Furthermore, if a deviation occurs in the formation location of the dummy electrodes, or a misalignment occurs during the stacking operation for forming a laminate, dummy electrodes may not be properly exposed at a predetermined surface of the laminate. When the dummy electrodes are not sufficiently exposed, a plating film may not be uniformly formed. When the plating film is not uniformly formed, there is a possibility that joining defects may occur between the plating film and the original internal electrodes, resulting in a decrease in reliability of the multilayer electronic component.

SUMMARY OF THE INVENTION

To overcome the problems described above, preferred embodiments of the present invention provide a method for manufacturing a multilayer electronic component and a multilayer electronic component manufactured by the manufacturing method.

According to preferred embodiments of the present invention, a method for manufacturing a multilayer electronic component includes a step of preparing a laminate which has a substantially rectangular solid shape having first and second principal surfaces opposed to each other, first and second end surfaces, and first and second side surfaces, the first and second end surfaces and the first and second side surfaces connecting the first and second principal surfaces, which includes a plurality of stacked insulator layers and a plurality of internal electrodes extending along the interfaces between the insulator layers, and in which an end of each of the plurality of internal electrodes is exposed at a predetermined surface corresponding to one of the first and second end surfaces, the ends of the plurality of internal electrodes being isolated from each other; a step of forming external electrodes on the predetermined surfaces of the laminate such that the ends of the plurality of internal electrodes exposed at the predetermined surfaces are electrically connected to each other by the corresponding external electrodes; and a step of forming thick-film edge electrodes at edge portions of the first and second principal surfaces and the first and second side surfaces adjacent to the first and second end surfaces by applying a conductive paste including a metal powder and a glass frit, followed by baking, the thick-film edge electrodes being connected to either of the external electrodes.

In the method for manufacturing a multilayer electronic component according to a preferred embodiment of the present invention, the step of forming the external electrodes includes a step of attaching a plurality of conductive particles having a particle size of at least about 1 μm, for example, to the predetermined surfaces of the laminate prepared in the step of preparing the laminate, and a step of performing plating directly on the predetermined surfaces to which the conductive particles are attached.

In order to perform the step of attaching the conductive particles, for example, preferably, a sandblasting process is performed on the predetermined surfaces, in which the conductive particles are mixed into abrasive particles having an abrasive action. Alternatively, preferably, a brushing process is performed on the predetermined surfaces, in which a brush with bristles composed of a resin including the conductive particles is used.

The method for manufacturing a multilayer electronic component according to the preferred embodiments of the present invention preferably further includes, before the step of performing plating, a step of attaching glass particles to the predetermined surfaces of the laminate, and includes after the step of performing plating, a step of performing heat treatment so that glass included in the glass particles flows or diffuses.

Furthermore, the method preferably includes a step of forming a plating film by performing plating on each of the thick-film edge electrodes and the external electrodes.

The multilayer electronic component obtained by the method according to the preferred embodiments of the present invention has structural features. The present invention is also directed to a multilayer electronic component having such structural features.

That is, according to preferred embodiments of the present invention, a multilayer electronic component includes a laminate which preferably has a substantially rectangular solid shape having first and second principal surfaces opposed to each other, first and second end surfaces, and first and second side surfaces, the first and second end surfaces and the first and second side surfaces connecting the first and second principal surfaces, which includes a plurality of stacked insulator layers and a plurality of internal electrodes extending along the interfaces between the insulator layers, and in which an end of each of the plurality of internal electrodes is exposed at a predetermined surface corresponding to one of the first and second end surfaces, the ends of the plurality of internal electrodes being isolated from each other; external electrodes disposed on the first and second end surfaces such that the ends of the plurality of internal electrodes exposed at the first and second end surfaces are electrically connected to each other by the corresponding external electrodes, the external electrodes being substantially composed of plating deposits; and thick-film edge electrodes disposed at edge portions of the first and second principal surfaces and the first and second side surfaces adjacent to the first and second end surfaces, such that the thick-film edge electrodes are connected to either of the external electrodes, the thick-film edge electrodes including a metal powder and a glass frit, wherein a plurality of conductive particles having a particle size of at least about 1 μm, for example, are distributed in a boundary portion between each of the predetermined surfaces and each of the external electrodes substantially composed of plating deposits.

According to the preferred embodiments of the present invention, when adjacent plating deposits grow and are linked to each other, the conductive particles function as bridges. Therefore, the plating deposits are easily linked to each other, and the amount of growth of plating required for linking is decreased. For this reason, it is possible to form a plating film in a satisfactory state on a predetermined surface of the laminate even when the distance between the ends of the adjacent internal electrodes is relatively large.

Furthermore, according to the preferred embodiments of the present invention, even in a region at which the ends of internal electrodes are not exposed, by attaching conductive particles, it is possible to form a plating film in a satisfactory state.

Furthermore, according to the preferred embodiments of the present invention, since the particle size of the conductive particles is set to be at least about 1 μm, it is possible to more reliably accelerate the linking phenomenon of plating deposits.

Moreover, since dummy electrodes as those described in Japanese Unexamined Patent Application Publication No. 2004-40084 are not required, the cost for forming the dummy electrodes can be eliminated, and the rate of occurrences of defects, such as a positional deviation of the dummy electrodes, can be decreased.

According to the preferred embodiments of the present invention, when a sandblasting process is performed in which the conductive particles are mixed into abrasive particles in order to attach the conductive particles, it is possible to perform a step of sufficiently exposing the ends of the internal electrodes at the predetermined surfaces of the laminate simultaneously in the step of attaching the conductive particles. Furthermore, when the conductive particles are made of a metal, the conductive particles are attached in an embedded state to the predetermined surfaces of the laminate. Therefore, even if cleaning is performed using an abrasive powder, the conductive particles are prevented from being removed.

When a brushing process is performed using a brush with bristles made of a resin including the conductive particles in order to attach the conductive particles, the same advantage can be obtained as when the sandblasting process is performed. Furthermore, in the brushing process, adherence of a plating film which is subsequently formed can be improved as compared to the sandblasting process.

Furthermore, since the thick-film edge electrodes are reliably formed so as to be connected to the external electrodes at the edge portions of the principal surfaces and the side surfaces adjacent to the end surfaces, the joining reliability during mounting by soldering is improved, and it is possible to prevent moisture or other contaminants from entering an inside of the laminate from the periphery of the external electrodes formed by plating.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Referring to FIG. 1 and FIGS. 2A to 2C, a multilayer electronic component 1 according to a first preferred embodiment of the present invention and a method for manufacturing the same will be described.

Figure 1:
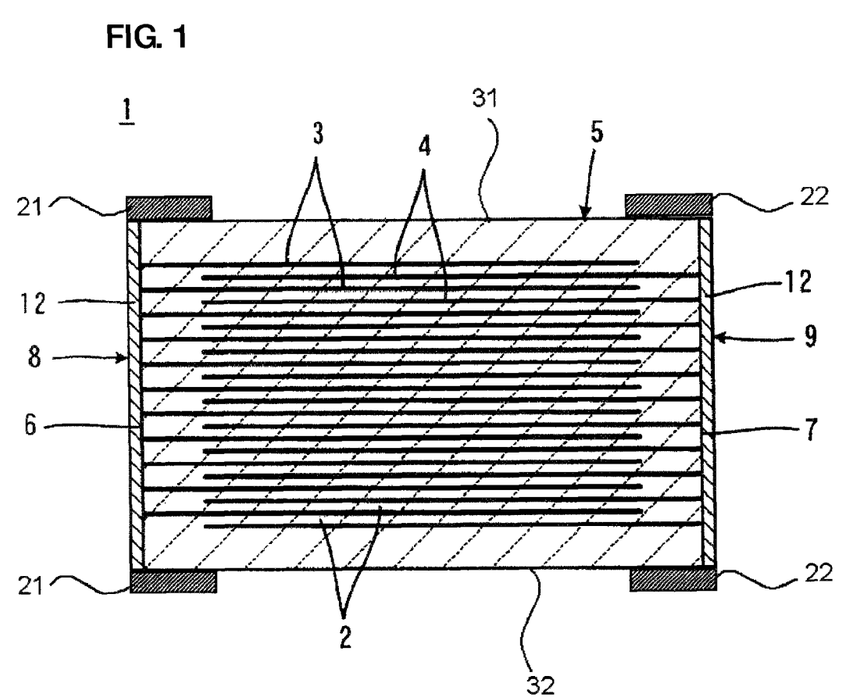
FIG. 1 is a cross-sectional view showing a multilayer electronic component according to a first preferred embodiment of the present invention.

First, as shown in FIG. 1, the multilayer electronic component 1 includes a laminate 5 defining a main body of the component. The laminate 5 preferably has a substantially rectangular solid shape having first and second principal surfaces 31 and 32 opposed to each other, first and second end surfaces 6 and 7, and first and second side surfaces (not shown in FIG. 1), the first and second end surfaces 6 and 7 and the first and second side surfaces connecting the first and second principal surfaces 31 and 32.

The laminate 5 includes a plurality of stacked insulator layers 2 and a plurality of internal electrodes 3 and 4 extending along the interfaces between the insulator layers 2. When the multilayer electronic component 1 defines a monolithic ceramic capacitor, the insulator layers 2 are composed of a dielectric ceramic. An end of each of the plurality of internal electrodes 3 is exposed at the end surface 6, and an end of each of the plurality of internal electrodes 4 is exposed at the end surface 7. External electrodes 8 and 9 are disposed so as to electrically connect the ends of the internal electrodes 3 and the ends of the internal electrodes 4, respectively.

Each of the external electrodes 8 and 9 is made of a plating film 12 including plating deposits formed by wet plating, such as electrolytic plating or electroless plating. That is, examples of the film defining each of the external electrodes 8 and 9 do not include a conductive paste film, a vacuum-deposited film, a sputtered film, or other materials The plating film 12 includes Cu as a major component, for example.

The multilayer electronic component 1 further includes thick-film edge electrodes 21 and 22 disposed at edge portions of the first and second principal surfaces 31 and 32 and the first and second side surfaces adjacent to the first and second end surfaces 6 and 7 such that the thick-film edge electrodes 21 and 22 are connected to the first and second external electrodes 8 and 9, respectively. Each of the thick-film edge electrodes 21 and 22 is made of a sintered body including a metal powder and a glass frit.

Figure 2A:
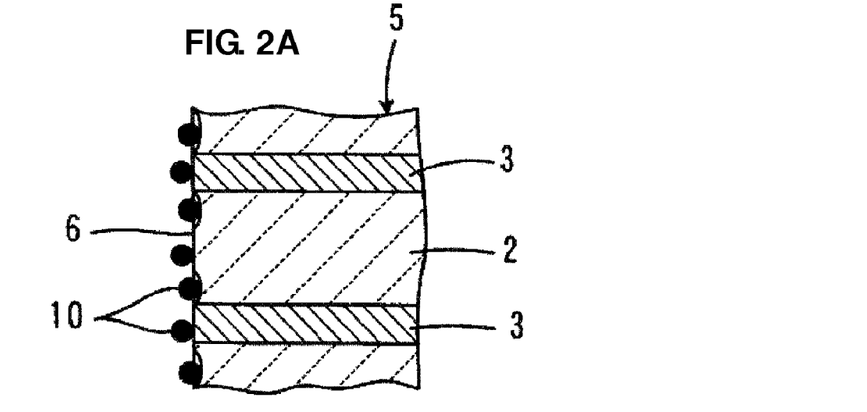
FIGS. 2A to 2C are enlarged cross-sectional views showing a portion of a laminate shown in FIG. 1 and illustrating the formation steps of an external electrode.
Figure 2B:
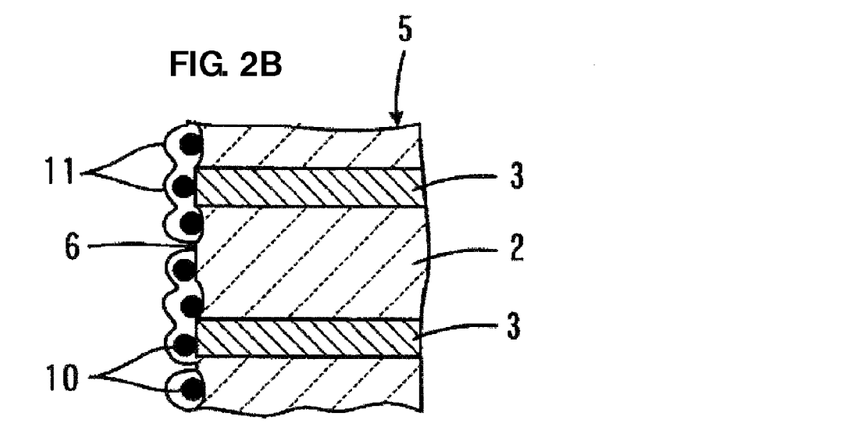
Figure 2C:
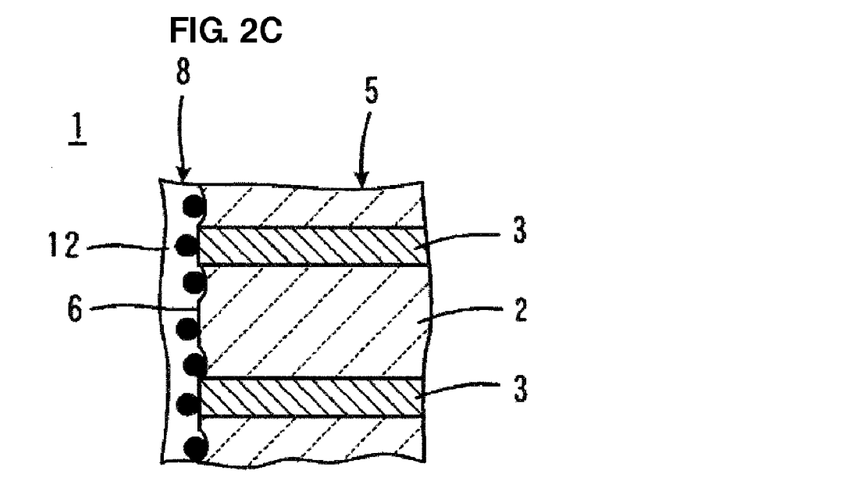

Next, a method for manufacturing the multilayer electronic component 1 shown in FIG. 1 will be described, focusing on a method of forming the external electrodes 8 and 9, with reference also to FIGS. 2A to 2C. FIGS. 2A to 2C are enlarged cross-sectional views showing a portion of the laminate 5 shown in FIG. 1 and showing the end surface 6. The other end surface 7 and the exposed internal electrodes 4 is substantially the same as that of the end surface 6 and the internal electrodes 3.

First, a laminate 5 is prepared, the laminate 5 including a plurality of stacked insulator layers 2 and a plurality of internal electrodes 3 and 4 extending along the interfaces between the insulator layers 2, in which an end of each of the internal electrodes 3 is exposed at the end surface 6, and an end of each of the internal electrodes 4 is exposed at the end surface 7.

Next, a step of forming external electrodes 8 and 9 on the end surfaces 6 and 7, respectively, is performed such that the ends of the internal electrodes 3 exposed at the end surface 6 are electrically connected to each other and the ends of the internal electrodes 4 exposed at the end surface 7 are electrically connected to each other.

Next, a thick-film paste including glass frit is applied to edge portions of the first and second principal surfaces 31 and 32 and the first and second side surfaces adjacent to the first and second end surfaces 6 and 7 of the laminate 5 so as to be connected to either of the first and second external electrodes 8 and 9, and then a heat treatment is performed. Thereby, first and second thick-film edge electrodes 21 and 22 are formed.

A method of forming the external electrodes 8 and 9 will be described in detail below.

First, as shown in FIG. 2A, a step of attaching a plurality of conductive particles 10 having a particle size of at least about 1 μm, for example, to the end surfaces 6 and 7 of the laminate 5 is performed. As the conductive particles 10, for example, metal particles, such as copper particles, tin particles, or gold particles, are preferably used.

In order to attach the conductive particles 10, for example, a sandblasting process is used. That is, sandblasting is performed on the end surfaces 6 and 7 of the laminate 5 with the conductive particles 10 being mixed into abrasive particles having an abrasive action. In the sandblasting process, even when the internal electrodes 3 and 4 are recessed from the end surfaces 6 and 7 and are not sufficiently exposed, it is possible to grind the insulator layers 2 so that the internal electrodes 3 and 4 are sufficiently exposed at the end surfaces 6 and 7, respectively. Furthermore, when metal particles are used as the conductive particles 10, the conductive particles 10 can be attached in an embedded state to the end surfaces 6 and 7. Therefore, the conductive particles 10 are prevented from being removed in the cleaning operation to remove abrasive particles.

In order to attach the conductive particles 10, a brushing process may be used instead of the sandblasting process. That is, brushing is performed on the end surfaces 6 and 7 of the laminate 5 using a brush with bristles made of a resin including the conductive particles 10. In the brushing process, as in the sandblasting process described above, it is possible to grind the insulator layers 2 so that the internal electrodes 3 and 4 are sufficiently exposed at the end surfaces 6 and 7, respectively. Furthermore, conductive particles 10, made of a metal can be attached in an embedded state to the end surfaces 6 and 7. Furthermore, in the brushing process, as will be described later, adherence of a plating film is improved.

Next, a step of performing plating directly on the end surfaces 6 and 7 to which the conductive particles 10 have been attached is performed. In the plating step, first, as shown in FIG. 2B, plating deposits 11 are precipitated so as to cover the exposed portions of the internal electrodes 3 and 4 and the conductive particles 10. When the plating process further proceeds, the plating deposits 11 grow and adjacent plating deposits are linked to each other. As shown in FIG. 2C, adjacent plating deposits 11 are combined to form a continuous plating film 12. The conductive particles 10 have a function of further accelerating the linking of the adjacent plating deposits 11.

In such a manner, as shown in FIG. 1, a multilayer electronic component 1 in which external electrodes 8 and 9 made of the plating films 12 are disposed is obtained. In the multilayer electronic component 1, a plurality of conductive particles 10 having a particle size of at least about 1 μm, for example, are distributed in a boundary portion between each of the end surfaces 6 and 7 and each of the plating films 12 as shown in FIG. 2C.

Furthermore, in the sandblasting process or the brushing process performed to attach the conductive particles 10, if glass particles are attached to the end surfaces 6 and 7 of the laminate 5, for example, by mixing the glass particles into the conductive particles 10 before the plating step, and if a heat treatment is performed so that glass defining the glass particles is allowed to flow or diffuse after the plating step, adherence of the plating film 12 can be further improved.

In the multilayer electronic component 1 described above, each of the external electrodes 8 and 9 is made of a single-layered plating film 12. At least one other layer of plating film may be formed. An example of a multilayer electronic component in which each external electrode is formed so as to be made of a plating film having a plurality of layers will be described with reference to FIG. 3.

Figure 3:
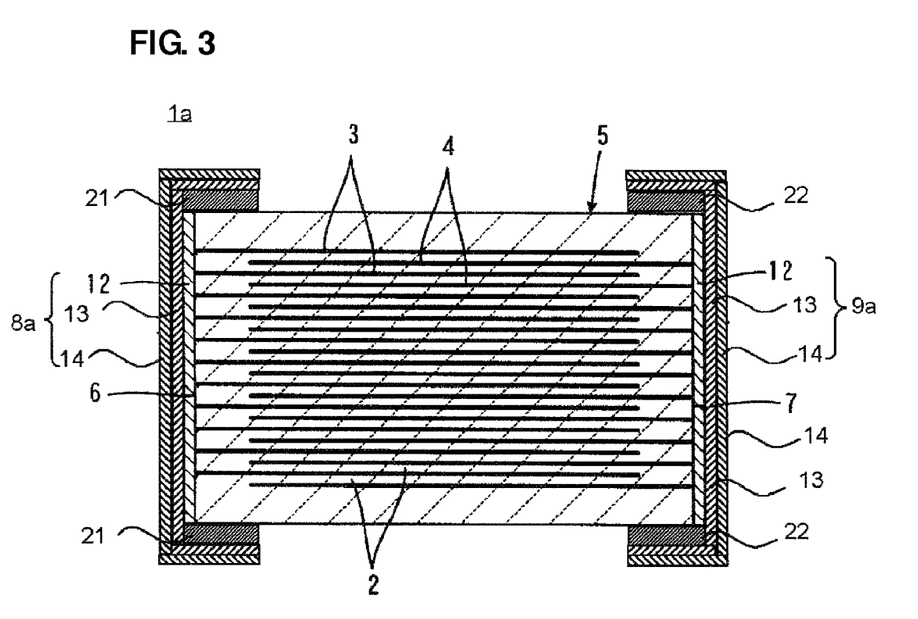
FIG. 3 is a cross-sectional view showing a multilayer electronic component according to a second preferred embodiment of the present invention.

FIG. 3 is a cross-sectional view showing a multilayer electronic component 1a according to a second preferred embodiment of the present invention and corresponds to FIG. 1. In FIG. 3, the same elements as those in FIG. 1 are represented by the same reference numerals, and the duplicate description thereof is omitted.

Regarding external electrodes 8a and 9a of the multilayer electronic component 1a shown in FIG. 3, using a plating film 12, as an underlying layer, formed on each of the end surfaces 6 and 7 of the laminate 5, an intermediate plating film 13 and an outer plating film 14 as second plating films are formed by electrolytic plating or electroless plating as in the plating film 12.

The outer plating film 14 is required to have good wettability with respect to solder, and therefore preferably includes Sn, Au, or other suitable material as a major component. In this preferred embodiment, the underlying plating film 12 includes, for example, Cu as a major component. In this case, since the intermediate plating film 13 is required to have a function of preventing solder leaching during the soldering operation, preferably, the intermediate plating film 13 includes, for example, Ni as a major component. Furthermore, when the underlying plating film 12 includes Ni as a major component, the intermediate plating film 13 may be omitted.

Furthermore, preferably, the intermediate plating films and the outer plating films 14 are formed after thick-film edge electrodes 21 and 22 are formed after the formation of the underlying plating films 12. The reason for this is that the heat treatment performed during the formation of the thick-film edge electrodes enables interdiffusion between the underlying plating film 12 and each of the internal electrodes 3 and 4, and adhesion of the underlying plating film 12 to each of the end surfaces 6 and 7 is improved, thereby preventing penetration of the plating solution. Note that this phenomenon is prominent when the underlying plating film 12 includes Cu as a major component, the internal electrodes 3 and 4 includes Ni as a major component, and the heat treatment temperature is at least about 800° C.

The present invention has been described above with reference to the preferred embodiments shown in the drawings. It is to be understood that various alterations can be made within the scope of the invention.

For example, typical examples of the multilayer electronic component to which the present invention is applied preferably include monolithic chip capacitors, but the invention can also be applied to monolithic chip inductors, monolithic chip thermistors, and other suitable devices.

Consequently, although insulator layers provided in the multilayer electronic component have an electrically insulating function, the material for the insulator layers is not particularly limited. That is, the insulator layers are not limited to those made of a dielectric ceramic, but may be made of a piezoelectric ceramic, a semiconductive ceramic, a magnetic ceramic, a resin, or other suitable material.

Furthermore, in each of the preferred embodiments described above, the plating film 12 is preferably designed so as to entirely cover each of the end surfaces 6 and 7. However, the present invention can be also applied to a design in which each of the end surfaces 6 and 7 are not necessarily covered entirely. For example, the invention can be applied to a case in which an end surface has a plurality of regions at which internal electrodes are exposed, and a plating film 12 is applied to each of the plurality of regions.

An example performed to confirm the effects of preferred embodiments of the present invention will be described below.

EXAMPLE

In the Example, in order to attach conductive particles, a sandblasting process was used.

As laminates for sample multilayer electronic components, laminates for monolithic ceramic capacitors with a size of about 1.90 mm in length, about 1.05 mm in width, and about 1.05 mm in height, for example, were prepared, in which insulator layers were made of a barium titanate-based dielectric ceramic and internal electrodes including Ni as a major component. In each of the laminates, the thickness of each insulator layer was about 10 μm, for example, the thickness of each internal electrode was about 2 μm, for example, and the thickness of each of upper and lower outer layers not provided with internal electrodes was about 200 μm, for example.

Next, sandblasting was performed on end surfaces of each of the laminates at which the internal electrodes were exposed. In the sandblasting process, abrasive particles made of alumina with a diameter of about 1 μm, for example, were used. As shown in Table 1 below, with respect to Sample Nos. 1 to 3, conductive particles with a diameter of about 1 μm made of a metal shown under the heading "Material of conductive particles" were mixed in an amount of about 1% by volume of the abrasive particles, and with respect to Sample Nos. 4 and 5, conductive particles were not mixed.

Next, the conduction ratio at the end surface of the laminate on which sandblasting had been performed was determined by a method in which element mapping analysis was performed on the entire end surface of the laminate using an energy dispersive X-ray microanalyzer (EDX), and the conduction ratio was calculated according to the following formula:

Conduction ratio [%]={(area occupied by Ni of internal electrodes+area occupied by conductive particles)/total area of end surface}×100.

Furthermore, even if the ceramic includes the same element as that of the conductive particles, since the concentration of the metal defining the conductive particles is high at about 100%, it is possible to clearly distinguish the conductive particles. The conduction ratio thus obtained is shown in Table 1.

Next, the laminate was placed in a horizontal rotating barrel with a capacity of about 300 mL, and about 100 mL of iron media with a diameter of about 0.7 mm was also placed therein. Then, the rotating barrel was immersed in a Cu strike plating bath at about 25° C. in which the pH was adjusted to about 8.5. A current was applied at a current density of about 0.11 A/dm² for about 60 minutes while rotating the barrel at about 2.6 m/min, and thereby a Cu plating film was directly formed on the end surface of the laminate at which internal electrodes were exposed. The Cu strike plating bath included about 14 g/L of copper pyrophosphate, about 120 g/L of pyrophosphoric acid, and about 10 g/L of potassium oxalate.

Next, the rotating barrel including the laminate on which the Cu plating film was formed was immersed in a copper pyrophosphate plating bath (PYROBRITE process produced by C. Uyemura Co., Ltd.) at about 55° C. in which the pH was adjusted to about 8.8. A current was applied at a current density of about 0.30 A/dm² for about 60 minutes while rotating the barrel at about 2.6 m/min. Thereby, another Cu plating film was formed on the Cu plating film described above, and the total thickness of the Cu plating films was about 10 μm.

Next, with respect to each sample, the ratio of the area covered with the Cu plating films to the entire area of the end surface of the laminate, i.e., the plating coverage, was determined by a method in which element mapping analysis was performed using an EDX as in the conduction ratio determination, and the plating coverage was calculated according to the following formula:

Plating coverage [%]={area covered with plating metal/area of entire end surface}×100.

The plating coverage is shown in the column of "Coverage" in Table 1.

Next, thick-film edge electrodes were formed only on Sample Nos. 1, 2, and 5 shown in Table 1 by the method described below. First, Cu powder and a glass frit inclusing ZnO—B₂O₃—SiO₂-based glass as a major component were mixed, and an appropriate amount of an organic vehicle was added thereto. The resulting mixture was mixed and dispersed using a triple roll mill, and thereby a conductive paste was obtained. Then, the conductive paste was applied to edge portions of the principal surfaces and the side surfaces adjacent to the end faces in the laminate of each of Sample Nos. 1, 2, and 5. Baking was performed in a nitrogen atmosphere at about 800° C. for about 5 hours, and thereby thick-film edge electrodes connected to the Cu plating films was formed.

Next, the laminate provided with the Cu plating films was placed back into the horizontal rotating barrel, and the horizontal rotating barrel was immersed in a Watts bath for nickel electrolytic plating (temperature about 60° C., about pH 4.2). A current was applied at a current density of about 0.15 A/dm² for about 60 minutes while rotating the barrel at about 2.6 m/min, and thereby a Ni plating film with a thickness of 4 about μm was formed on the Cu plating films and the thick-film edge electrodes.

Next, the horizontal rotating barrel was immersed in an electrolytic tin plating bath (Sn-235 produced by Dipsol Chemicals Co., Ltd.) which was adjusted to a temperature of about 33° C. and about pH 5.0. A current was applied at a current density of about 0.10 A/dm² for about 60 minutes while rotating the barrel at about 2.6 m/min, and thereby a Sn plating film with a thickness of about 4 μm was formed on the Ni plating film. Then, washing with water was performed, followed by drying at about 80° C. for about 10 minutes. In such a manner, monolithic capacitor samples of Sample Nos. 1 to 5 were obtained.

Then, with respect to 100 monolithic capacitors of each of Sample Nos. 1 to 5, a pressure cooker bias test (PCBT) was carried out under quite severe conditions. That is, a voltage of about 6.3 V was applied for about 72 hours in the environment of a pressure of about 1 atm, a temperature of about 125° C., and a humidity of about 95% RH. A number of defectives in 100 samples was counted. The results are shown in Table 1.

TABLE 1

| Sample No. | Conductive particles | Material of conductive particles | Thick-film edge electrode | Conduction ratio at end surface (%) | Coverage of Cu plating film (%) | PCBT Number of defectives |
|---|---|---|---|---|---|---|
| 1 | Present | Cu | Present | 30 | 100 | 0/100 |
| 2 | Present | Sn | Present | 28 | 100 | 0/100 |
| 3 | Present | Cu | Absent | 31 | 100 | 20/100 |
| 4 | Absent | — | Absent | 10 | 20 | 100/100 |
| 5 | Absent | — | Present | 9 | 20 | 72/100 |

As shown in Table 1, with respect to Sample Nos. 1 to 3 in which the conductive particles are mixed into the abrasive particles in the sandblasting step, a higher conduction ratio can be obtained than Sample Nos. 4 and 5 in which the conductive particles are not mixed. In Sample Nos. 1 to 3, coverage of about 100% is obtained. In contrast, the coverage is low in Sample Nos. 4 and 5.

Furthermore, in Sample Nos. 1 and 2 in which the conductive particles are attached and which are provided with the thick-film edge electrodes, the defect rate is zero. The reasons for this are believed to be, in addition to the fact that the coverage of the Cu plating film is improved, that moisture is prevented from entering the laminate from the edges of the Cu plating films by the thick-film edge electrodes, and that adherence of the Cu plating films to the end surface of the laminate is increased by the heat treatment, thus entry of moisture is further prevented. This is also reflected in the results of Sample No. 3 in which the conductive particles are attached and which is not provided with the thick-film edge electrodes.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing a multilayer electronic component comprising:
a step of preparing a laminate having first and second principal surfaces opposed to each other, first and second end surfaces, and first and second side surfaces, the first and second end surfaces and the first and second side surfaces connecting the first and second principal surfaces, which includes a plurality of stacked insulator layers and a plurality of internal electrodes extending along the interfaces between the insulator layers, and in which an end of each of the plurality of internal electrodes is exposed at a predetermined surface corresponding to one of the first and second end surfaces, the ends of the plurality of internal electrodes being isolated from each other;

a step of forming external electrodes on the predetermined surfaces of the laminate such that the ends of the plurality of internal electrodes exposed at the predetermined surfaces are electrically connected to each other by the corresponding external electrodes; and a step of forming thick-film edge electrodes at edge portions of the first and second principal surfaces and the first and second side surfaces adjacent to the first and second end surfaces by applying a conductive paste containing a metal powder and a glass frit, followed by baking, the thick-film edge electrodes being connected to either of the external electrodes; wherein the step of forming the external electrodes includes a step of attaching a plurality of conductive particles having a particle size of at least about 1 μm to the predetermined surfaces of the laminate prepared in the step of preparing the laminate; and a step of performing plating directly on the predetermined surfaces to which the conductive particles are attached.

2. The method for manufacturing a multilayer electronic component according to claim 1, wherein the step of attaching the conductive particles includes a step of performing a sandblasting process on the predetermined surfaces, in which the conductive particles are mixed into abrasive particles.

3. The method for manufacturing a multilayer electronic component according to claim 1, wherein the step of attaching the conductive particles includes a step of performing a brushing process, in which a brush having bristles made of a resin including the conductive particles is used.

4. The method for manufacturing a multilayer electronic component according to claim 1, further comprising:
 before the step of performing plating, a step of attaching glass particles to the predetermined surfaces of the laminate; and
 after the step of performing plating, a step of performing a heat treatment so that glass defining the glass particles is allowed to flow or diffuse.

5. The method for manufacturing a multilayer electronic component according to claim 1, further comprising a step of forming a plating film by performing plating on each of the thick-film edge electrodes and the external electrodes.

6. The method for manufacturing a multilayer electronic component according to claim 1, wherein the laminate is formed to have a substantially rectangular solid shape.

* * * * *